(12) United States Patent
Wang et al.

(10) Patent No.: US 11,011,503 B2
(45) Date of Patent: May 18, 2021

(54) DIRECT-BONDED OPTOELECTRONIC INTERCONNECT FOR HIGH-DENSITY INTEGRATED PHOTONICS

(71) Applicant: Invensas Bonding Technologies, Inc., San Jose, CA (US)

(72) Inventors: Liang Wang, Newark, CA (US); Rajesh Katkar, Milpitas, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 47 days.

(21) Appl. No.: 16/219,693

(22) Filed: Dec. 13, 2018

(65) Prior Publication Data

US 2019/0189603 A1 Jun. 20, 2019

Related U.S. Application Data

(60) Provisional application No. 62/599,146, filed on Dec. 15, 2017.

(51) Int. Cl.
*H01L 31/0203* (2014.01)
*H01L 25/16* (2006.01)
(Continued)

(52) U.S. Cl.
CPC ............ *H01L 25/167* (2013.01); *H01L 23/48* (2013.01); *H01L 23/481* (2013.01);
(Continued)

(58) Field of Classification Search
CPC . H01L 2224/32145; H01L 2924/15311; H01L 2224/16145; H01L 2224/83894; H01L 25/0657
(Continued)

(56) References Cited

U.S. PATENT DOCUMENTS 5,753,536 A   5/1998 Sugiyama et al.
5,771,555 A   6/1998 Eda et al.
(Continued)

FOREIGN PATENT DOCUMENTS

JP   60-257413 A   12/1985
JP   201333786 B2   2/2013
(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — S. V. Clark
(74) *Attorney, Agent, or Firm* — Lee & Hayes, P.C.

(57) ABSTRACT

Direct-bonded optoelectronic interconnects for high-density integrated photonics are provided. A combined electrical and optical interconnect enables direct-bonding of fully-processed optoelectronic dies or wafers to wafers with optoelectronic driver circuitry. The photonic devices may be III-V semiconductor devices. Direct-bonding to silicon or silicon-on-insulator (SOI) wafers enables the integration of photonics with high-density CMOS and other microelectronics packages. Each bonding surface has an optical window to be coupled by direct-bonding. Coplanar electrical contacts lie to the outside, or may circumscribe the respective optical windows and are also direct-bonded across the interface using metal-to-metal direct-bonding, without interfering with the optical windows. Direct hybrid bonding can accomplish both optical and electrical bonding in one overall operation, to mass-produce mLED video displays. The adhesive-free dielectric-to-dielectric direct bonding and solder-free metal-to-metal direct bonding creates high-density
(Continued)

electrical interconnects on the same bonding interface as the bonded optical interconnect. Known-good-dies may be used, which is not possible conventionally, and photolithography over their top surfaces can scale to high density.

17 Claims, 9 Drawing Sheets (51) Int. Cl.
| | |
|---|---|
| H01L 33/48 | (2010.01) |
| H01L 23/00 | (2006.01) |
| H01L 23/48 | (2006.01) |
| H01L 33/62 | (2010.01) |
| H01L 23/538 | (2006.01) |

(52) U.S. Cl.
CPC ......... *H01L 23/5385* (2013.01); *H01L 24/04* (2013.01); *H01L 24/08* (2013.01); *H01L 24/80* (2013.01); *H01L 24/83* (2013.01); *H01L 24/94* (2013.01); *H01L 24/95* (2013.01); *H01L 33/486* (2013.01); *H01L 33/62* (2013.01); *H01L 2224/08145* (2013.01); *H01L 2224/80895* (2013.01); *H01L 2224/83896* (2013.01); *H01L 2924/12041* (2013.01); *H01L 2924/12044* (2013.01); *H01L 2933/0033* (2013.01); *H01L 2933/0066* (2013.01)

(58) Field of Classification Search
USPC ............... 257/432, 434, 680, 686, 777, 778
See application file for complete search history.

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 6,962,835 B2 | 11/2005 | Tong et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,436,457 B2 * | 5/2013 | Crisp ................. H01L 25/0652 257/686 | |
| 8,441,111 B2 * | 5/2013 | Crisp ...................... H01L 23/13 257/684 | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,625,713 B2 * | 4/2017 | Helie ................. B23K 26/0624 | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,935,088 B2 | 4/2018 | Budd et al. | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,026,605 B2 | 7/2018 | Doub et al. | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2004/0157407 A1 | 8/2004 | Tong et al. | |
| 2005/0226299 A1 | 10/2005 | Horng et al. | |
| 2006/0057945 A1 | 3/2006 | Hsu et al. | |
| 2007/0111386 A1 | 5/2007 | Kim et al. | |
| 2011/0024918 A1 * | 2/2011 | Brunnbauer ............ H01L 24/96 257/777 | |
| 2011/0059275 A1 * | 3/2011 | Stark ...................... H01L 23/10 428/34 | |
| 2011/0113828 A1 * | 5/2011 | Matsumoto ......... C03C 23/0025 65/33.2 | |
| 2012/0189317 A1 | 7/2012 | Heck et al. | |
| 2013/0122617 A1 | 5/2013 | Lott et al. | |
| 2014/0175655 A1 | 6/2014 | Chen et al. | |
| 2015/0064498 A1 | 3/2015 | Tong | |
| 2016/0343682 A1 | 11/2016 | Kawasaki | |
| 2017/0186670 A1 | 6/2017 | Budd et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2020/0235085 A1 * | 7/2020 | Tao ....................... H01L 25/105 | |

FOREIGN PATENT DOCUMENTS

| | | |
|---|---|---|
| JP | 2018-160519 A | 10/2018 |
| WO | 2005-043584 A2 | 5/2005 |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

International Search Report and Written Opinion, dated Apr. 17, 2019, for PCT Application No. PCT/US2018/065687, 16 pages.

\* cited by examiner

```
┌─────────────────────────────────────────────────────┐
│ CREATE A FIRST OPTICAL WINDOW ON A FIRST PLANAR     │
│ BONDING SURFACE OF A DIE OR A WAFER, THE DIE OR     │
│ WAFER INCLUDING A PHOTONIC DEVICE                   │
│ 802                                                 │
└─────────────────────────────────────────────────────┘
                          ↓
┌─────────────────────────────────────────────────────┐
│ CREATE A FIRST ELECTRICAL CONTACT OF THE PHOTONIC   │
│ DEVICE IN THE FIRST PLANAR BONDING INTERFACE, THE   │
│ FIRST ELECTRICAL CONTACT AT LEAST PARTIALLY         │
│ CIRCUMSCRIBING THE FIRST OPTICAL WINDOW             │
│ 804                                                 │
└─────────────────────────────────────────────────────┘
                          ↓
┌─────────────────────────────────────────────────────┐
│ CREATE A SECOND ELECTRICAL CONTACT OF THE PHOTONIC  │
│ DEVICE IN THE FIRST PLANAR BONDING INTERFACE, THE   │
│ SECOND ELECTRICAL CONTACT AT LEAST PARTIALLY        │
│ CIRCUMSCRIBING THE FIRST ELECTRICAL CONTACT         │
│ 806                                                 │
└─────────────────────────────────────────────────────┘
                          ↓
┌─────────────────────────────────────────────────────┐
│ CREATE A SECOND OPTICAL WINDOW IN COMMUNICATION     │
│ WITH A SILICON WAVEGUIDE IN A SECOND PLANAR BONDING │
│ SURFACE ASSOCIATED WITH A WAFER                     │
│ 808                                                 │
└─────────────────────────────────────────────────────┘
                          ↓
┌─────────────────────────────────────────────────────┐
│ CREATE A FIRST ELECTRICAL CONTACT OF THE WAFER IN   │
│ THE SECOND PLANAR BONDING INTERFACE, THE FIRST      │
│ ELECTRICAL CONTACT AT LEAST PARTIALLY CIRCUMSCRIBING│
│ THE SECOND OPTICAL WINDOW                           │
│ 810                                                 │
└─────────────────────────────────────────────────────┘
                          ↓
┌─────────────────────────────────────────────────────┐
│ CREATE A SECOND ELECTRICAL CONTACT OF THE WAFER IN  │
│ THE SECOND PLANAR BONDING INTERFACE, THE SECOND     │
│ ELECTRICAL CONTACT AT LEAST PARTIALLY CIRCUMSCRIBING│
│ THE FIRST ELECTRICAL CONTACT                        │
│ 812                                                 │
└─────────────────────────────────────────────────────┘
```

DIRECT-BONDED OPTOELECTRONIC INTERCONNECT FOR HIGH-DENSITY INTEGRATED PHOTONICS

RELATED APPLICATIONS

This patent application claims the benefit of priority to U.S. Provisional Patent Application No. 62/599,146, filed Dec. 15, 2017 and incorporated by reference herein in its entirety.

BACKGROUND

Silicon, as a good conductor of infrared light, has become important to optoelectronics and provides many technical and economic advantages. Silicon photonics combines the advantages of photonics with the widespread use of silicon in conventional CMOS manufacturing. Photonics offers high-performance communication, low power of operation, and small size and weight. CMOS offers volume production, low cost, miniaturization, and high integration. Silicon photonics therefore provides high integration, miniaturization, higher bandwidth, lower cost, and lower power of operation. Micro-optoelectronic integration using silicon photonics cuts the cost of optical links.

Compound semiconductors for optoelectronics and silicon photonics combine an element from group III of the periodic table (e.g., In, Ga, Al) with an element from group V of the periodic table (e.g., As, P, Sb, N). This yields twelve different III-V compounds, but the most commercially useful of these are currently GaAs, InP, GaN, and GaP.

Silicon photonic circuits most often operate in the infrared at a wavelength of 1550 nanometers, at which silicon becomes a good conduit for transmission of the infrared optical beams. A top and bottom cladding of silicon dioxide (silica) on a waveguide structure made of silicon confines the infrared light within the silicon by total internal reflection (TIR) due to differences in the refraction indices of silicon and silicon dioxide, similar in some respects to how light is conducted in a fiber optic filament. Silicon photonic devices that use such silicon waveguides can be constructed by semiconductor fabrication techniques previously used exclusively for microelectronics. Since silicon is already used as the substrate in most conventional integrated circuits for microelectronics, hybrid devices in which the optical and electronic components are integrated onto a single microchip can be made with conventional semiconductor fabrication processes, sometimes even without retooling.

Processes that fabricate photonic devices using silicon and silicon dioxide can also utilize conventional silicon on insulator (SOI) techniques that are already well-known in microelectronics, providing a SOI waveguide layer on a wafer, to which optical dies such as LEDs, lasers, and photodetectors may be conventionally attached by less-than-ideal means.

Platforms based on silicon photonics that could foster highly integrated electronic-photonic convergence face several obstacles. Due to optical mode matching requirements, a thick transparent substrate, such as sapphire or indium phosphide (InP) cannot conventionally be bonded onto a silicon wafer. This is because the III-V compound semiconductors, while providing additional function over silicon, are usually from different sources with different base materials. So instead of conventional bonding, flip-chip and/or die-to-wafer (D2 W) interconnection and packaging techniques are conventionally used to bond such optical dies to a silicon wafer. Die-to-wafer bonding is required for integrating dies with III-V compound semiconductors onto the silicon chip, but the bulky solder interconnects characteristic of these techniques pose an obstacle to the optical path. Options that use these solder interconnects and apply mirroring optics to compensate are complex and costly. So to avoid the solder interconnects, fabrication in conventional photonics usually bonds unprocessed photonic dies to the silicon wafer, but then has to fabricate metal contacts of the optoelectronic devices on the dies in a retroactive front-end step after the dies have already been bonded to the wafer.

Because the dies with the III-V compound semiconductors are conventionally not fully processed before bonding to the silicon wafer, the process cannot be optimized by selecting known-good dies, and thus front-end processes have to be performed after the dies have already been bonded to the wafer. Photolithography over the topographic surface of the dies, after die-to-wafer bonding, has limited precision and cannot scale to high density.

SUMMARY

Direct-bonded optoelectronic interconnects for high-density integrated photonics are provided. A combined electrical and optical interconnect enables direct-bonding of fully-processed optoelectronic dies that have III-V semiconductor devices aboard to surfaces, such as the surfaces of silicon, silicon-on-insulator (SOI) wafers, quartz and so forth, enabling the integration of photonics with high-density CMOS IC driver circuitry in microelectronics packages. The direct-bonded optoelectronic interconnect may also be used in other wafer level production processes that bond organic LEDs (OLEDs) or quantum dot LEDs on a first wafer to CMOS driver circuitry on a second wafer. The example direct-bonded optoelectronic interconnect may also be used to direct-bond diced LED chips to wafers, or to other chips.

Each bonding surface of an LED wafer or chip, and a CMOS wafer or chip to be direct-bonded, has an optical window to be coupled by direct-bonding. Electrical contacts coplanar with the optical window are also direct-bonded across the same bonding interface using metal-to-metal direct-bonding. Direct hybrid bonding can accomplish both the optical bonding and the electrical bonding in one overall operation. Adhesive-free dielectric-to-dielectric direct bonding and solder-free metal-to-metal direct bonding create high-density electrical interconnects on the same bonding interface as the bonded optical interconnect. Since the optoelectronic dies can be fully-processed from the outset, known-good-dies may be used, which is not possible conventionally. Since the optoelectronic dies begin as fully-processed components, photolithography over their top surfaces can scale to high density.

The example optoelectronic interconnect may be used to construct photonic devices, including but not limited to photonic integrated circuits (PICs), also known as integrated optical circuits, and planar lightwave circuits (PLCs). In addition, the optoelectronic interconnect may used in the fabrication of photonic devices for fiber-optic communications, optical computing, for medical applications including minimally invasive scanner probes, for aeronautic and automotive applications, such as optical sensors for shape-sensing changes in flexing parts, and optical metrology, for example. The example optoelectronic interconnect may be used to fabricate photonic devices using wafer level processes and microelectronic packaging techniques.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes direct-bonded optoelectronic interconnects for high-density integrated photonics. A combined electrical and optical interconnect enables direct-bonding of fully-processed optoelectronic dies or wafers that include III-V semiconductor devices, OLEDs, or quantum dot LEDs to silicon, or silicon-on-insulator (SOI) wafers, particularly to CMOS wafers carrying IC driver circuitry, with or without built in silicon or other optical waveguides. The example direct-bonded optoelectronic interconnect enables the integration of photonics with cutting-edge production techniques used to make high-density CMOS and other microelectronics packages.

In this description, the term LED for "light-emitting-diode" also encompasses microLEDs and the various types of LEDs, such as phosphor-based LEDs, III-V semiconductor LEDs, OLEDS, quantum dot LEDs, and so forth.

Wafers used in the example processes may be silicon or silicon-on-insulator (SOI) wafers or may be made of other materials, such as quartz, polymer, and other, and may contain a silicon waveguide or other waveguide utilizing infrared light, for example. The example electrical and optical interconnect described herein is not limited to silicon-on-insulator (SOI) wafers, but SOI wafers are used as a working example.

First and second planar bonding surfaces of the die(s) and wafer to be bonded are made flat enough for a direct-bonding process. The respective optical windows of die and wafer are direct-bonded to each other across the bonding interface by a dielectric-to-dielectric (or oxide-oxide) direct-bonding process, for example. The respective coplanar metal electrical contacts are also direct-bonded to each other across the same bonding interface using a metal-to-metal direct-bonding process. When direct hybrid bonding (DBI® for example) is utilized, the nonmetal direct-bonding of the respective optical windows occurs first (Invensas Inc., a subsidiary of Xperi Corp., San Jose, Calif.). Then in an annealing step of the direct hybrid bonding operation, the complementary electrical contacts on opposing sides of the bonding interface are direct-bonded together forming metal-to-metal bonds. The nonmetal direct-bonding and then the metal direct-bonding results in a direct-bonded optoelectronic interconnect between dies bearing photonic III-V semiconductor devices on one side, and a silicon or SOI wafer bearing optoelectronic circuitry on the other side. The photonic devices may be lasers, photodetectors, optical diodes, LEDs, microLEDs, and so forth. LEDs are described herein, as a working example for the sake of description.

In an implementation, matching metal contacts on either side of the bonding interface between die and wafer, or between wafer and wafer, are in a different bonding area than the optical path provided by the optical areas to be interconnected by direct bonding, while remaining coplanar with the optical areas so that there is only one planar bonding interface for both optical and electrical interconnects created in one bonding operation. In an implementation, the electrical contacts to be direct-bonded between surfaces are coplanar with, and lie to the outside of the respective optical areas of the surfaces being direct-bonded together. In another implementation, the electrical contacts to be direct-bonded across the optoelectronic interconnect are coplanar with, and circumscribe, at least in part, the respective optical areas being direct-bonded together. The combined optical and electrical interconnect enables high-density integration of photonics into microelectronic packages, because the adhesive-free dielectric-to-dielectric bonding and the solder-free metal-to-metal bonding employed can create high-density electrical interconnects on the same bonding interface as the bonded optical interconnect, and can be scaled to high density.

Figure 1:
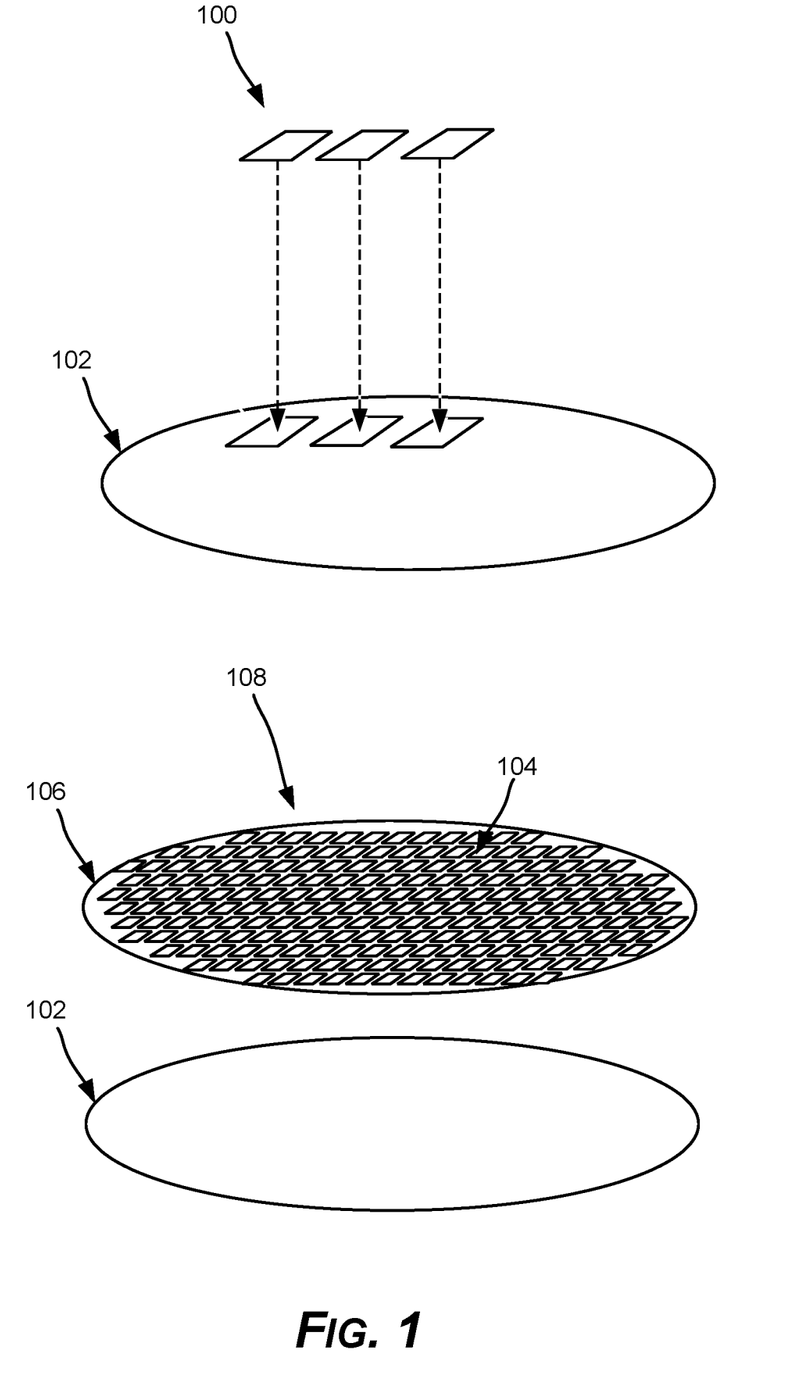
FIG. 1 is a diagram of optoelectronic dies with III-V semiconductor components aboard and with completed metallization and finished electrodes being direct-bonded to a wafer to make photonic devices integrated with high-density microelectronics.

FIG. 1 shows optoelectronic dies 100, such as fully-processed optoelectronic dies 100, with III-V semiconductor optical devices aboard and with completed metallization and finished electrodes, for example, being bonded to an example silicon wafer or to an example silicon-on-insulator (SOI) wafer 102 using die-to-wafer (D2W) techniques. The configuration of electrical contacts between die 100 and wafer 102, and the configuration of optical areas also to be interconnected between die 100 and wafer 102, enable the conductive contacts of the dies 100 to be metal-to-metal direct-bonded, without solder, while the dielectric surfaces of the optical areas are also direct bonded between die 100 and wafer 102 without adhesives. The solder-free process and absence of bulk solder enable formation of high-density electrical interconnects on the same planar bonding interface as the optical interconnect that is being created. Moreover, finished optoelectronic dies 100 can be used in the die-to-wafer bonding operation. Although the finished optical devices 100 are shown to be bonded to silicon or a SOI wafer 102 in FIG. 1, a finished optical device wafer can alternatively be hybrid direct-bonded to silicon, glass, quartz or SOI wafer.

In a wafer-to-wafer (W2 W) process, LEDs 104 or microLEDs (mLEDs) 104 may be formed or reconstituted on a wafer 106 or reconstituted wafer, which is then direct-bonded to another wafer 102 using the example optoelectronic interconnect described herein. The wafer 102 being bonded to can possess CMOS driver circuitry, for example, with optical waveguides.

Figure 2:
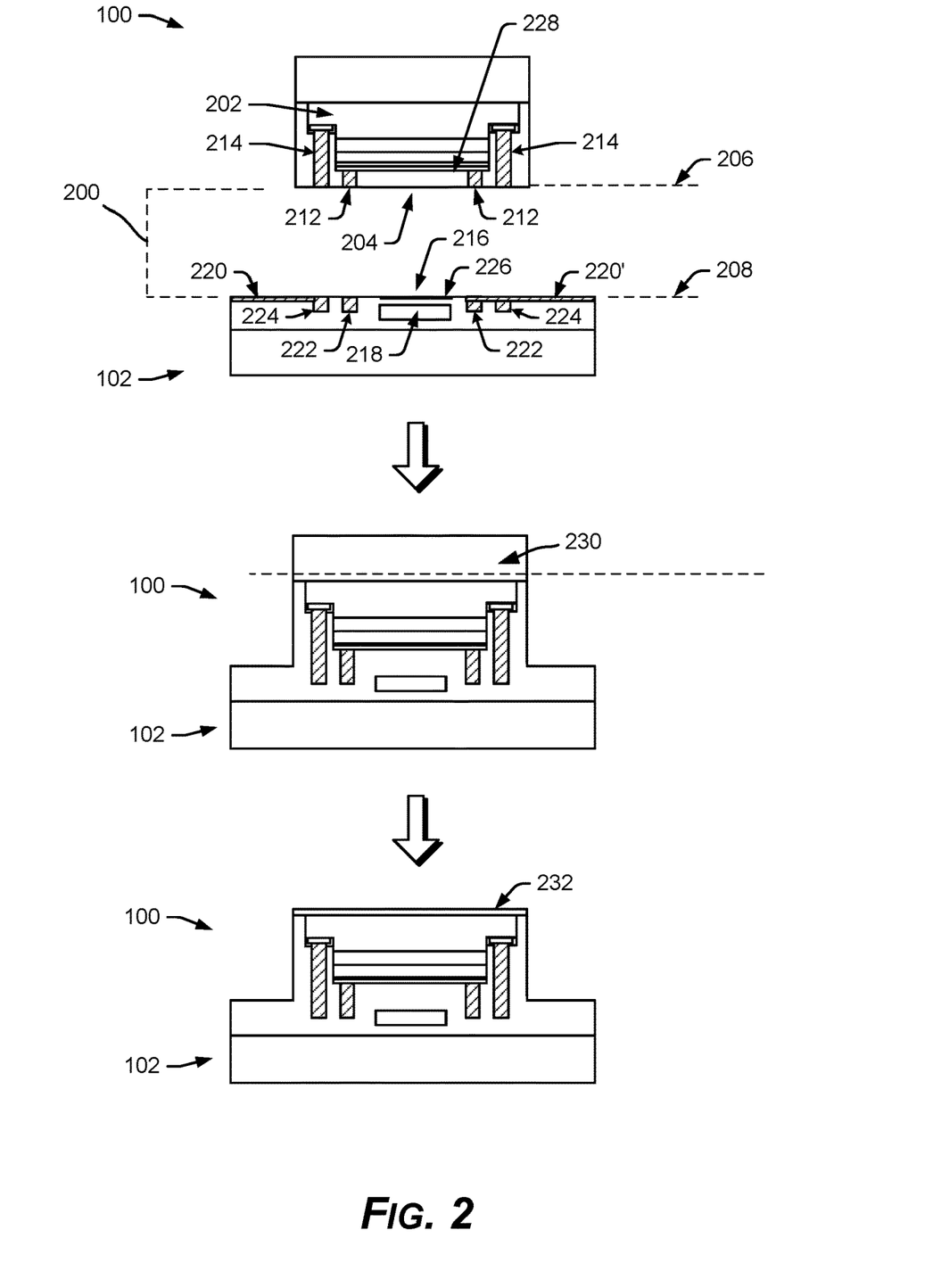
FIG. 2 is a side view diagram of an example optoelectronic interconnect implemented by direct-bonding in a single direct-bonding plane.

FIG. 2 shows an implementation of an example combined electrical and optical ("optoelectronic") interconnect 200 for high-density integrated photonics. In an implementation, an example die 100 includes an optoelectronic device 202 and an optical coupling area 204 of the die 100 in optical communication with the optoelectronic device 202. The die 100 may be a fully processed III-V die of a laser, photodiode, LED, and so forth. The example die 100 has a coupling plane 206 (also shown in FIG. 3) for optically and electrically coupling with a complementary coupling plane 208 of the wafer 102, such as a silicon-on-insulator (SOI) wafer, silicon, glass or other wafer. A segment of the coupling plane 206 of the die 100 contains the optical coupling area 204 of the die 100. Example direct-bonded LED arrays and applications are described in U.S. patent application Ser. No. 15/919,570 to Tao et al., filed Mar. 13, 2018 and incorporated by reference herein in its entirety. The mLED arrays in the above Tao et al. reference utilize the direct-bonded optoelectronic interconnect 200 described herein, for example.

The coupling planes 206 & 208 of the die 100 and wafer 102, respectively, are provided a high degree of physical flatness suitable for direct bonding of metals and nonmetals in the bonding planes 206 & 208. This flatness may be achieve by manufacture or by polishing, such as by chemical mechanical planarization (CMP), for example.

A first electrical contact 212 of the optoelectronic device 202 is disposed outside the perimeter of the optical coupling area 204, within the coupling plane 206 of the die 100. The first electrical contact 212 lies outside of, and in some cases may fully or at least partially surround the outside perimeter of the optical coupling area 204 in the coupling plane 206 of the die 100. A second electrical contact 214 of the optoelectronic device 202 is also disposed outside the perimeter of the optical coupling area 204, and in some cases may also be disposed outside a perimeter of the first electrical contact 212, in the coupling plane 206 of the die 100. When the second electrical contact 214 is situated past the outside perimeter of the first electrical contact 212, the second electrical contact 214 may at least partially surround the first electrical contact 212. In an implementation, the first ("inner") electrical contact 212 completely surrounds the optical coupling area 204 with an unbroken perimeter of metal trace in the coupling plane 206 of the die 100. In another implementation, as shown later in FIGS. 4-5, the first electrical contact 212 and the second electrical contact 214 may be pads or point-of-contact connectors for direct bonding that are simply located in a different region of the bonding interface than the optical bonding region 204.

The first electrical contact 212 of the die 100 (or optical device wafer) is also configured to match a complementary electrical contact 222 on the wafer 102 being bonded to, outside a region or a perimeter of a complementary optical coupling area 216 of the wafer 102. This places both complementary electrical contacts 212 & 222 outside the perimeter or the optical footprint of a silicon waveguide 218 in or under the optical coupling area 216 of the wafer 102.

In the shown example, from the standpoint of the planar bottom wafer side 208 of the bonding interface 200, instances of the example die 100 are capable of optically and electrically coupling with the wafer 102 upon joining respective coupling planes 206 & 208 of the dies 100 and wafer 102. The optical coupling area 216 of the wafer 102 occupies a flat segment of the coupling plane 208 of the wafer 102. For each die-to-wafer bonding site, the wafer 102 has a respective silicon waveguide 218 in optical communication with the optical coupling area 216 of the wafer 102, that is, above the silicon waveguide 218.

The wafer 102 has an optoelectronic circuit 220 & 220' or other electrical circuit, to be connected to the electronics of the die 100 across the bonding interface 200. Although the optoelectronic circuit 220 & 220' are depicted to be on the bonding surface 208, they may be underneath or embedded into or under the bonding surface 208. A first electrical contact 222 of the optoelectronic circuit 220 of the wafer 102 is complementary in planar geometric profile in the bonding plane 208 with the first electrical contact 212 in the coupling plane 206 of the die 100 (see FIG. 3, also). The first complementary electrical contact 222 of the wafer 102 is co-disposed in the coupling plane 208 of the wafer 102 and disposed outside a perimeter of the optical coupling area 216 of the wafer 102.

In the shown implementation, a second electrical contact 224 of the optoelectronic circuit 220 of the wafer 102 is disposed outside a perimeter of the first electrical contact 222 of the wafer 102, and is also disposed in the flat coupling plane 208 of the wafer 102. The second electrical contact 222 is complementary in flat profile to the corresponding second electrical contact 214 of the die 100, to which it will bond via metal-to-metal direct bonding.

Electrical routing paths (leads, conductive lines, traces) from the optoelectronic circuit 220 of the wafer 102 to the first and second complementary electrical contacts 222 & 224 of the wafer 102 may also be within or just under the coupling plane 208 of the wafer 102, as introduced above.

The optical coupling area 216 of the wafer 102 may include at least a grating surface 226 for an optical mode-match coupling between the optics of the die 100 and the silicon waveguide 218 of the wafer 102. In an implementation, the grating surface 226 may be less than 10 microns (p) wide for single mode infrared transmission in the silicon waveguide 218.

As described above, the die 100 has fully-processed electrodes for the optoelectronic device 202 aboard the die 100, and fully-processed first and second electrical contacts 212 & 214 for making the electrical interconnect with the corresponding electrical contacts 222 & 224 on a planar bonding interface 208 of the wafer 102. When the coupling plane 206 of the die 100 and the coupling plane 208 of the wafer 102 are joined, optical coupling and metal-to-metal electrical coupling occur in the same bonding operation at the combined coupling planes 206 & 208 being joined ("coupled plane" or "optoelectronic interconnect" 200).

A direct hybrid bonding operation, such as example DBI® direct hybrid bonding, for example, may be used to accomplish the dielectric-to-dielectric direct bonding (e.g., oxide-to-oxide direct bonding) of nonmetals that make up the surfaces of the complementary optical areas 204 & 216 of the die 100 and wafer 102. An annealing step of the same example direct hybrid bonding process also direct-bonds the respective metal electrodes together, and strengthens all direct bonds created in the example direct hybrid bonding process.

The coupled plane 200 at the bonding interface 206 & 208 perfects an optical couple between the optical coupling area 204 of the die 100 and the optical coupling area 216 of the wafer 102, mated in the joined coupling plane 200. The coupled plane 200 at the bonding interface also includes the metal-to-metal direct-bond between the first electrical contact 212 of the die 100 and the complementary electrical contact 222 of the wafer 102, and likewise includes the metal-to-metal direct-bond between the second electrical contact 214 of the die 100 and the complementary electrical contact 224 of the wafer 102.

A transparent conductive oxide (TCO) 228 or other similar film may be added between the III-V compound semiconductor (or optical device) 202 and the silicon waveguide 218 to enhance electrical conductivity into a III-V compound semiconductor 202, for example, or to enhance a uniformity of the electrical conductivity into a III-V compound semiconductor 202, when needed.

In an implementation, reflection loss may be reduced by roughening a bottom surface of the III-V compound semiconductor or optical device 202 by etching, for example. In another technique for reducing reflection loss, a selected dielectric material between the bottom surface of the III-V compound semiconductor 202 and the silicon waveguide 218 may be used to reduce a reflection loss between the III-V compound semiconductor 202 and the silicon waveguide 218. In an implementation, the dielectric material to be used has a refractive index approximately equal to the square root of the index of refraction of the silicon 218 multiplied by the index of refraction of the III-V compound semiconductor material 202. In another implementation, the dielectric material has a refractive index that is in the range between the index of refraction of the silicon 218 and the index of refraction of the III-V compound semiconductor 202.

Accordingly, some common indices of refraction for dielectrics and semiconductors, that can also be used for reduction of reflection loss in the example optoelectronic interconnect are:

| | |
|---|---|
| Silicon | n = 3.9766 |
| SiO$_2$ | n = 1.4585 |
| ITO (Indium tin oxide) | n = 1.858 |
| GaN | n = 2.3991 |
| InP | n = 3.5896 |
| GaAs | n = 3.9476 |
| TiO$_2$ | n = 2.6142 |

As an example, TiO$_2$ may be used as the intervening dielectric material to reduce reflection loss. Dielectric materials such as aluminum doped zinc oxide (AZO) and gallium doped zinc oxide (ZNO) may also be used, depending on the III-V compound semiconductor 202 that is present. It is also likely that the optical interconnect is between silicon oxide and GaN as silicon oxide may act as the optical waveguide The optical part of the optoelectronic interconnect 200 can also be optimized by configuring an optical thickness between the bottom surface of the III-V compound semiconductor 202 and a top surface of the silicon waveguide 218. The thickness can be an odd multiple of one-quarter of the wavelength of the operative light, such as infrared light at 1550 nm, that is used in each photonic device being formed by joining the optoelectronic die 100 and the wafer 102.

Depending on the thickness of a substrate 230 of the die 100 to be bonded to a wafer 102, layers of the substrate 230 may be removed by laser liftoff, grinding, etching, and so forth, to thin the dies 100 being bonded. Then, a reflective layer, metal, or distributed Bragg reflector (DBR) 232, for example, may be added on top of the optoelectronic device 202 of the die 100 to keep the light contained and favorably reflected into the optoelectronic devices 202 on the dies 100.

Figure 3:
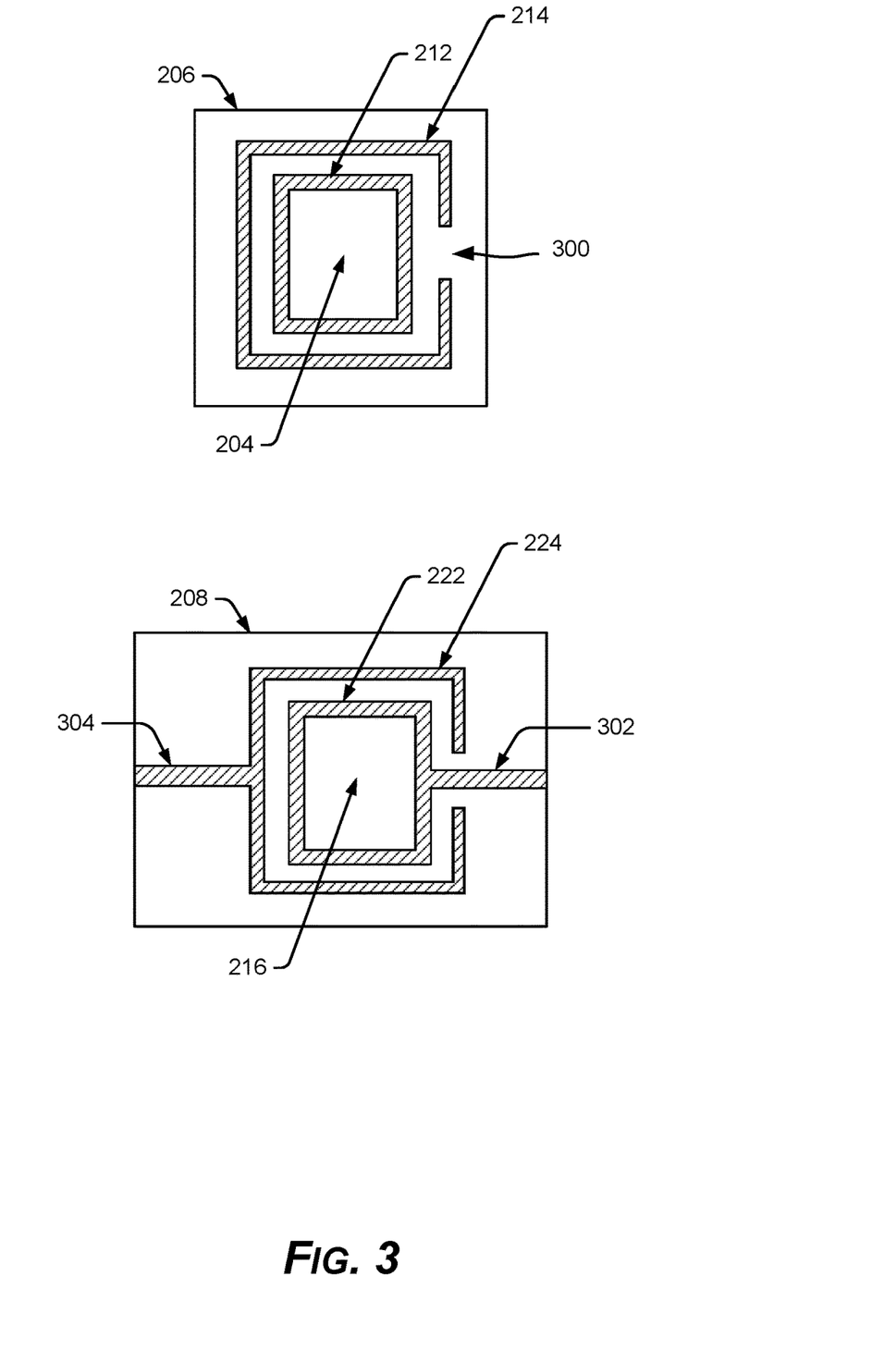
FIG. 3 is a top view diagram of example respective direct-bonding planes of an example optoelectronic die and an example silicon or silicon-on-insulator (SOI) wafer to be direct-bonded together to make an example optoelectronic interconnect.
Figure 4:
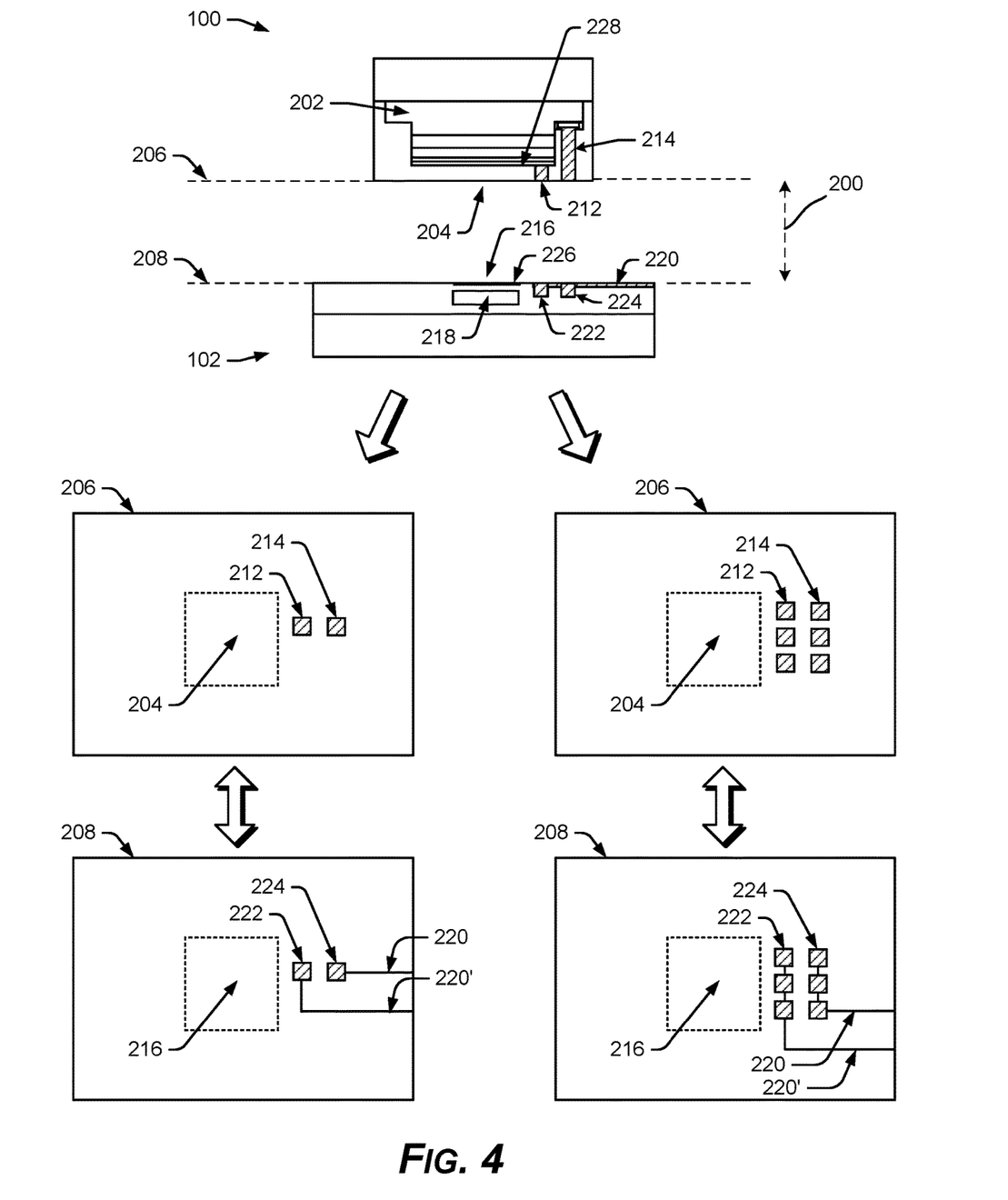
FIG. 4 is a diagram of an example optoelectronic interconnect in which the first electrical contact of the photonic device and the second electrical contact of the photonic device are each single metal pads to be direct-bonded.
Figure 5:
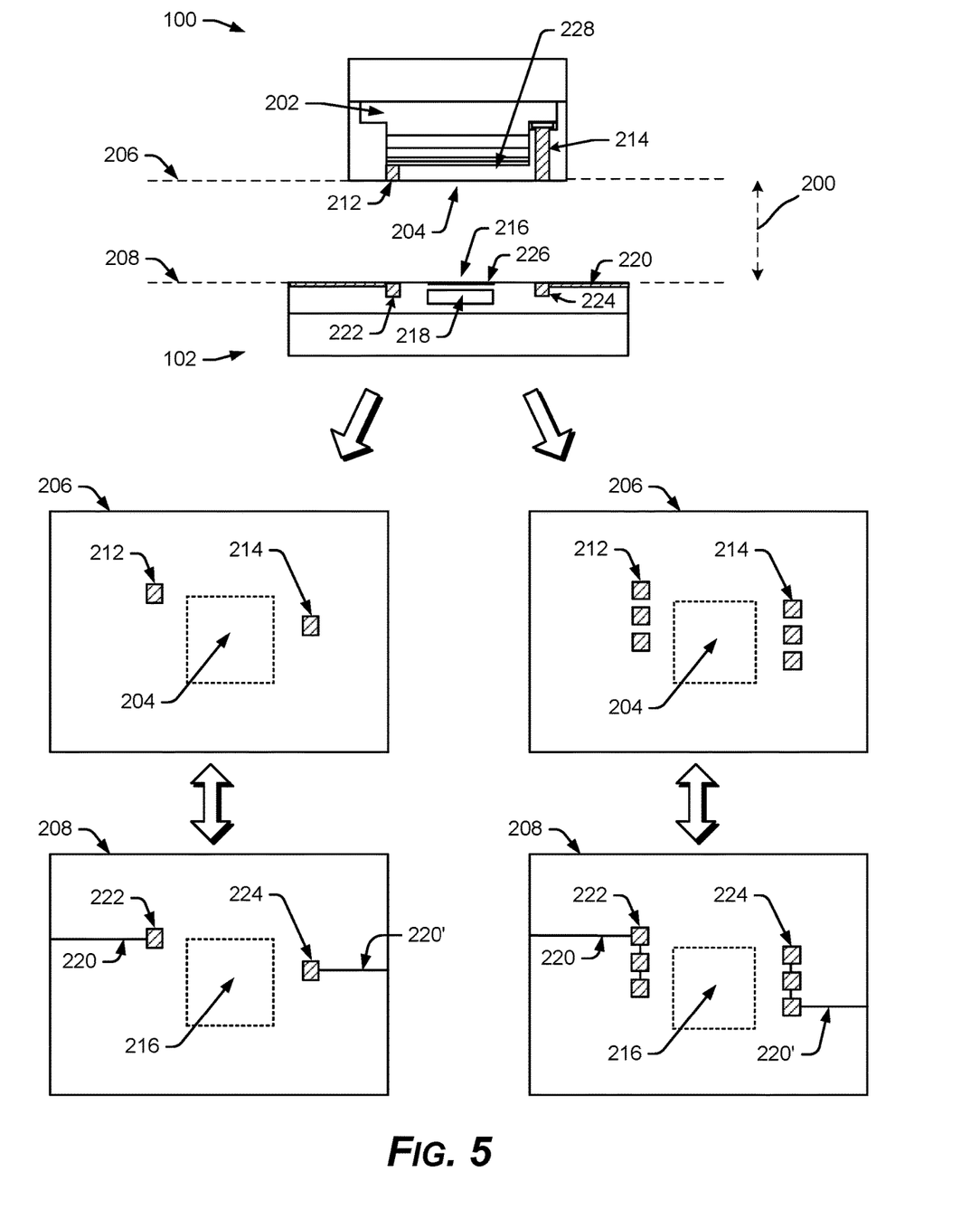
FIG. 5 shows an implementation of the example optoelectronic interconnect in which the first electrical contact of the photonic device and the second electrical contact of the photonic device are each one or more metal pads on two or more sides outside of the optical areas to be direct-bonded.

FIG. 3 shows top views (or bottom views) of the example bonding planes 206 & 208 of the respective die 100 and wafer 102 forming the example optoelectronic interconnect 200. FIG. 2, by comparison, shows a side view. This configuration of the electrodes 212 & 222 and 214 & 224 to be direct-bonded together, are just one example configuration. Other example configurations are shown in FIGS. 4-5.

In FIG. 3, in an example embodiment, the first coupling plane 206 formed on a side of the die 100 has the first optical bonding area 204 formed in the coupling plane 206, the first electrical contact 212 around the outside perimeter of the first optical window 204, which is also disposed in the coupling plane 206 of the die 100, and has the second electrical contact 214 around the outside perimeter of the first "inner" electrical contact 212, all of these disposed in the coupling plane 206 of the die 100.

The wafer-side bonding plane 208 of the electrical and optical interconnect 200 for high-density integrated photonics includes the wafer-side optical window 216 in the coupling plane 208, the first electrical contact 222 of the wafer 102 outside a perimeter of the optical window 216, the second electrical contact 224 of the wafer 102 outside a perimeter of the first electrical contact 222, and electrical leads 302 & 304 connected respectively to the first electrical contact 222 and the second electrical contact 224, all of these disposed in the coupling plane 208 of the wafer 102.

In an implementation, the second complementary electrical contact 224 of the optoelectronic circuit 220 of the wafer 102 is an open-loop or other discontinuous flat shape within the coupling plane 208 of the wafer 102, and has a gap 300 in its open-loop or discontinuous form for accommodating the electrical routing 302 from the circuit 220 to the first complementary electrical contact 222 within the coupling plane 208 of the wafer 102. The gap 300 allows the second electrical contact to 224 remain electrically insulated from the lead 302 or other conductive line leading to the first electrical contact 222 of the optoelectronic circuit 220.

The first electrical contact 212 of the die 100 and the first complementary electrical contact 222 of the wafer 102 may each be a conductive line or trace or ring in the form of a square, rectangle, circle, or oval, for example, surrounding respective first and second optical windows 204 & 216.

The electrical and optical interconnect 200 for high-density integrated photonics, when joined, has a dielectric-to-dielectric direct-bonded optical interconnect between the (first) optical window 204 of the die 100 and the (second) optical window 216 of the wafer 102. The electrical and optical interconnect 200 also has solder-free metal-to-metal direct-bonded electrical interconnects between the first and second electrical contacts 212 & 214 of the die 100 and their complementary first and second electrical contacts 222 & 224 of the wafer. The direct-bonding of both the optical areas 204 & 216 and the respective electrical contacts 212 & 222, and 214 & 224 creates a complete bonding interface 200 that creates the capacity for high-density optoelectronic interconnects 200 via the joined coupling planes 206 & 208 between the die 100 and the wafer 102.

Although the electrical contacts 212, 214, 222 & 224 are shown as exposed to the surface in FIG. 3, in one scenario only portions of the contacts in the form of small pads are exposed and actually bonded. Not all CMP processes can planarize bonding surfaces with exposed metal loading in the form of rings as depicted in FIG. 3. Instead, in some implementations, a more uniformly exposed metal loading (distributed pads) may be more suitable from an optimized CMP process.

Although the electrical contacts 212, 214, 222 & 224 are shown as a conductive line or trace formed in a ring, a square, a rectangle, a circle, or an oval shape, it is also possible that each of the electrical contacts is in the form of only one (or more) pads, not necessarily circumscribing the optical windows 204 or 206. Also, each such pad may be electrically connected to its die 100 by a through-conducting via. Examples of pad-bonding implementations are shown in FIGS. 4-5.

After the direct-bonded optoelectronic interconnects are formed between dies 100 and wafer 102, the wafer 102 and its bonded dies 100, may be diced or individuated into individual optoelectronic devices, or into groups of optoelectronic devices. For some applications a wafer 102 with direct-bonded bonded dies 100 may be left intact and undiced, with an array of the optoelectronic devices on relatively large sections of the wafer 102, for example, or on the entire wafer 102.

FIG. 4 shows an implementation of the example optoelectronic interconnect 200 in which the first electrical contact 212 of the photonic device 100 and the second electrical contact 214 of the photonic device 100 are each single metal pads, polished and prepared for direct metal-to-metal bonding with complementary pads 222 and 224 on the surface 208 of the wafer 102 being direct bonded to. The contacts 212 & 214 to be direct-bonded are both off to one side of the optical areas 204 & 216, in a different direct-bonding area that does not interfere with the direct-bonding of the optical areas 204 & 216. The individual bonding pads 212 & 214, or contacts, may be single instances of respective pads (left) or multiple redundant instances of pads for each lead or line (right), for bonding reliability. Multiple pads (right) may also be used when the photonic device has more than two leads to be connected across the optoelectronic interconnect 200.

Traces or conductive lines 220 & 220' coupling the bonding pads 222 & 224 to a circuit, such as a LED driver circuit, of the wafer 102 being bonded to are usually embedded or disposed below the bonding surface 208 itself.

FIG. 5 shows an implementation of the example optoelectronic interconnect 200 in which the first electrical contact 212 of the photonic device 100 and the second electrical contact 214 of the photonic device 100 are each metal pads, polished and prepared for direct metal-to-metal bonding. Complementary pads 222 and 224 are on the surface 208 of the wafer 102 being direct-bonded to. In this configuration, the contacts 212 & 214 to be direct-bonded are on two or more sides outside of the optical areas 204 & 216 to be direct-bonded, in one or more different direct-bonding areas that do not interfere with the light path or with the direct-bonding between surfaces of the optical areas 204 & 216. The individual bonding pads 212 & 214, or contacts, may be single instances or respective pads (left), or may be multiple redundant instances (right) of pads for each line or lead, for bonding reliability, if one of the redundant pads bonds weakly, for example. Multiple pads (right) may also be used when the photonic device has more than two types of leads to be connected across the optoelectronic interconnect 200.

Traces or conductive lines 220 & 220' coupling the bonding pads 222 & 224 to a circuit, such as a LED driver circuit, of the wafer 102 being bonded to are usually embedded or disposed below the bonding surface 208 itself.

Figure 6:
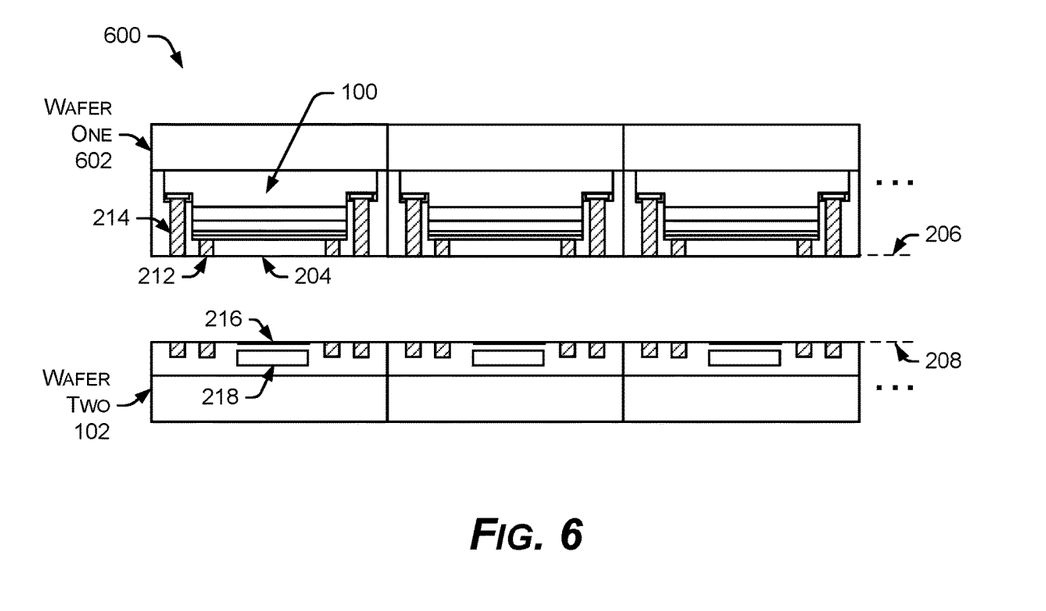
FIG. 6 shows an example photonic device, in which photonic devices, such as LEDs, mLEDs, or laser sources are arrayed on a wafer using the example optoelectronic interconnect.

FIG. 6 shows an example apparatus 600, in which photonic devices, such as an array of LEDs, mLEDs, or laser sources are created or arrayed on a wafer 602 or a reconstituted wafer to make the photonic device. The second wafer 102 being bonded to may have electronic circuitry, such as CMOS driver circuitry to be connected to the photonic devices on the first wafer 602 by direct-bonding of electrical contacts 212 & 214 between the two wafers 602 & 102 across the flat, optoelectronic interface (206 & 208 joined by direct-bonding). To form the optoelectronic interconnect, the two surfaces 206 & 208 of the optoelectronic interface are flattened with CMP or other techniques for achieving ultra-flat direct-bonding surfaces. The surfaces 206 & 208 being direct-bonded may also include respective optical bonding areas 206 & 216. The second wafer 102, in addition to electronic driver circuitry, may also contain photonic circuits (light paths), into which light is injected or illuminated through waveguides 218 being direct-bonded to the optical areas 204 of LEDs 100 or other photonic devices.

Direct hybrid bonding, such as DBI® brand hybrid bonding, creates direct-bonds between the nonmetallic (e.g., $SiO_2$) optical areas 204 & 216, and in the same overall operation creates direct-bonds between the metallic electrical contacts 212 & 214 across the same optoelectronic interface 206 & 208 to create wafer-to-wafer optoelectronic interconnects at each photonic device.

Figure 7:
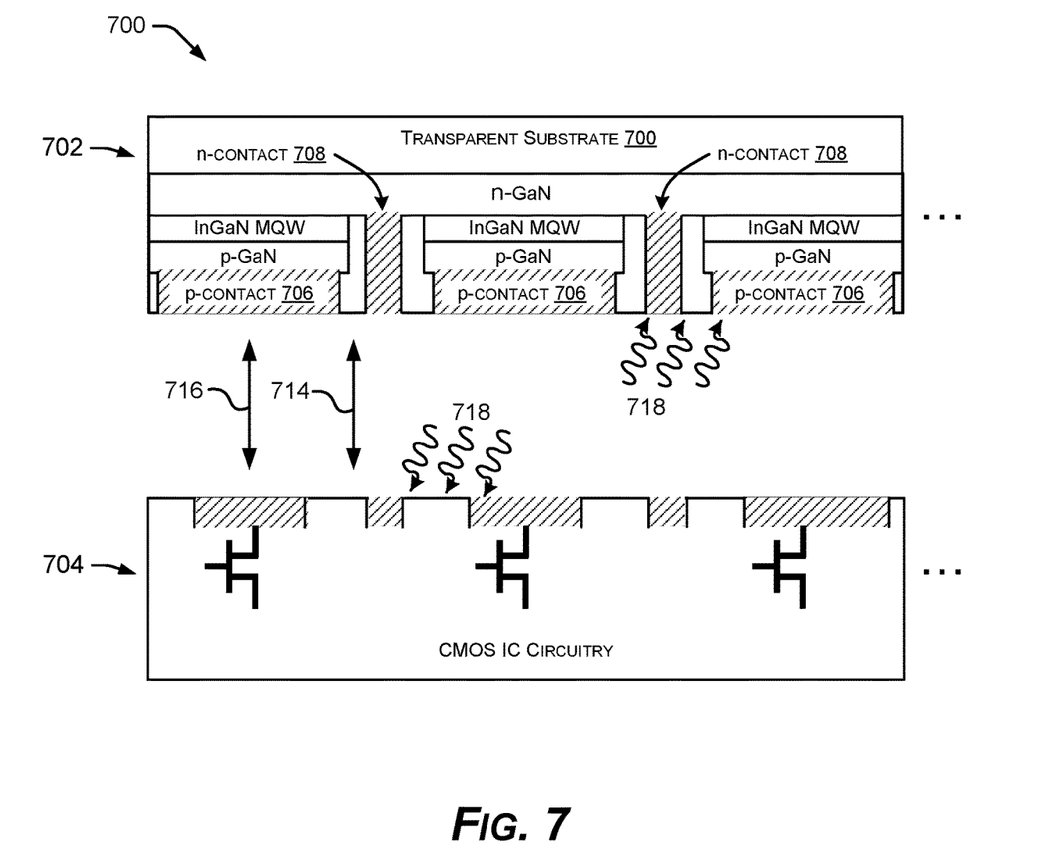
FIG. 7 shows another example photonic device, in which photonic devices, such as LEDs, mLEDs, or laser sources are arrayed on a wafer using the example optoelectronic interconnect.

FIG. 7 shows another example apparatus 700, in which photonic devices, such as LEDs, mLEDs, or laser sources are arrayed on a wafer 702. The second wafer 704 being bonded to, may have electronic circuitry, such as CMOS driver circuitry to be connected to the photonic devices on the first wafer 702 by direct-bonding of electrical contacts 706 & 708 between the two wafers 702 & 704 across the flat direct-bonding interface (710 joined to 712).

The two wafers 702 & 704 of the example apparatus 700 may be direct-bonded with a direct hybrid bonding process, such as DBI® brand direct hybrid bonding, in which both non-metals 714 and conductive metals 714 are direct-bonded together in the same overall direct hybrid bonding process. The nonmetals to be direct-bonded 714 may be dielectrics, and may or may not be optical areas for transmitting light.

In an implementation, the direct-bonding processes create a thin mLED array 700, in which the wafer 702 with the LED structures is direct-bonded to a CMOS driver chip wafer 704.

To achieve the direct hybrid bonding, in an implementation, after the flat and activated surface 710 on the mLED device wafer 702 is formed, the CMOS wafer 704 is planarized with CMP or other means of obtaining an ultra-flat surface, and plasma-activated 718, for example.

The two wafers 702 & 704 are then direct-bonded, between nonmetallic dielectric surfaces 714 and also between metallic conductors 716, during an annealing phase, for example. After the nonmetallic dielectric surfaces have directed bonded 714 on contact, the direct-bonding of metal conductors 716 can occur at an annealing temperature of approximately 100-200° C. to form a strong direct-bonded interconnect of both metals and nonmetals, to make the example mLED array 700.

Example Processes

Figure 8:
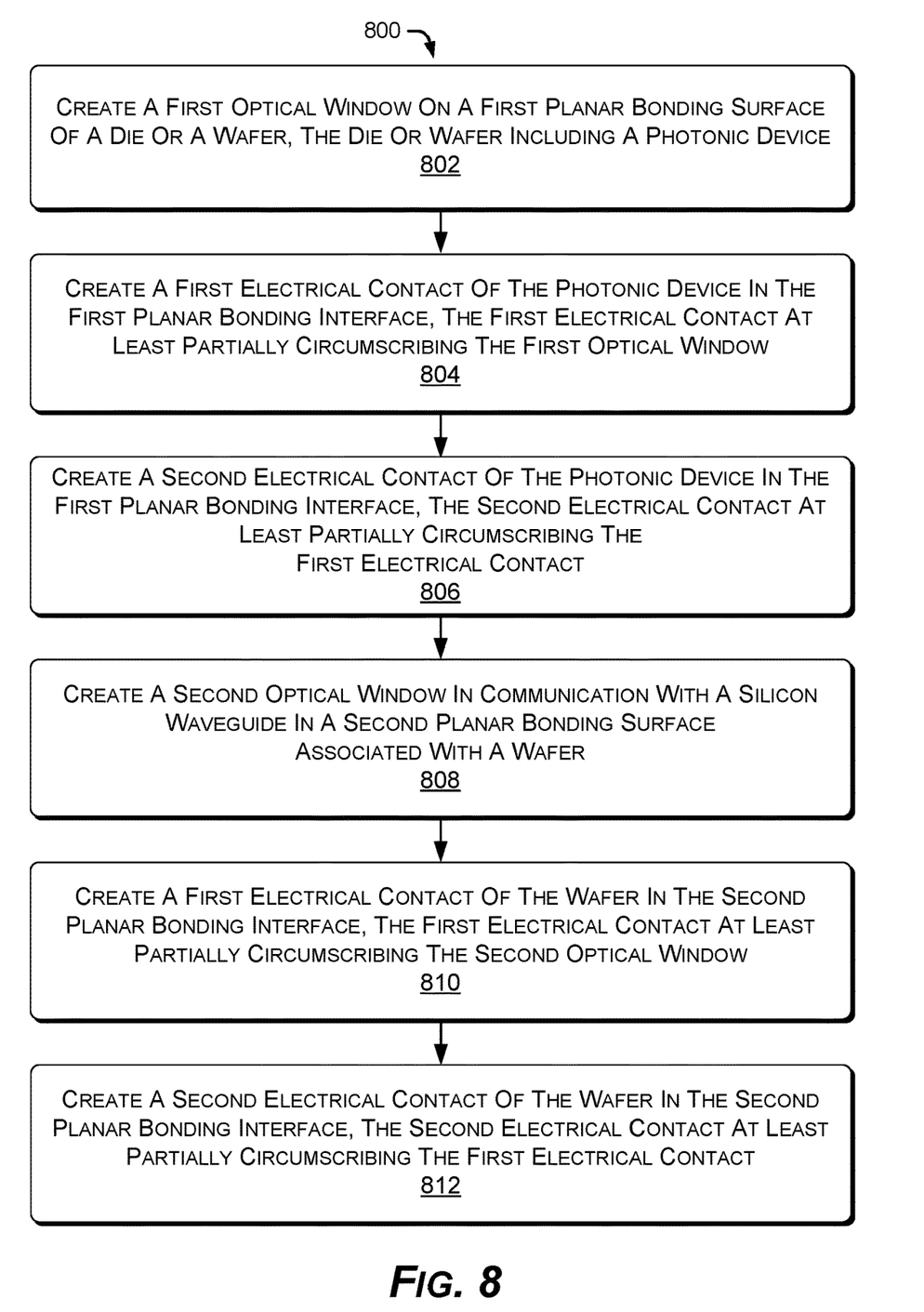
FIG. 8 is a flow diagram of an example method of creating planar bonding interfaces suitable for direct-bonding a die that includes a photonic device, such as a photonic device utilizing a III-V semiconductor compound to a wafer, such as a silicon or SOI wafer, to form an optoelectronic interconnect for high-density integrated photonics.

FIG. 8 shows an example method 800 of creating a planar bonding interface suitable for direct-bonding a die that includes a photonic device, such as a III-V semiconductor photonic device, to a wafer, such as a silicon or SOI wafer, to form an optoelectronic interconnect for high-density integrated photonics. In some implementations, the optoelectronic interconnect may direct-bond both electrical contacts across an interface and may direct-bond an optical pathway across the same interface. In the flow diagram of FIG. 8, operations of the example method 800 are shown as individual blocks.

At block 802, a first optical window is created in a first planar bonding surface of a die, the die including a photonic device, such as a sensor or a LED based on a III-V semiconductor compound.

At block 804, a first electrical contact of the photonic device of the die is created in the first planar bonding surface, the first electrical contact at least partially circumscribing the first optical window of the die.

At block 806, a second electrical contact of the photonic device of the die is created in the first planar bonding surface, the second electrical contact at least partially circumscribing the first electrical contact.

At block 808, a second optical window in communication with a silicon waveguide is created in a second planar bonding surface associated with a wafer.

At block 810, a first electrical contact of an optoelectronic circuit of the wafer is created in the second planar bonding surface, the first electrical contact at least partially circumscribing the second optical window of the silicon or SOI wafer.

At block 812, a second electrical contact of the optoelectronic circuit of the wafer is created in the second planar bonding surface, the second electrical contact at least partially circumscribing the first electrical contact of the second planar bonding surface.

The first and second planar bonding surfaces of the die and wafer, respectively, are made flat enough for a direct-bonding process, by CMP, for example. The respective optical windows are direct-bonded to each other across the bonding interface by a dielectric-to-dielectric direct-bonding process (e.g., an oxide-to-oxide direct-bonding process), for example. The respective coplanar metal electrical contacts are direct-bonded to each other across the bonding interface using a metal-to-metal direct-bonding process. When direct hybrid bonding (DBI® for example) is utilized, the nonmetal direct-bonding of the respective optical windows may occur first. Then in an annealing step of the direct hybrid bonding process, the complementary electrical contacts on opposing sides of the bonding interface are direct-bonded into metal-to-metal bonds. The nonmetal direct-bonding and then the metal direct-bonding results in a direct-bonded optoelectronic interconnect between dies bearing photonic devices, such as III-V semiconductor photonic devices, and a wafer bearing optoelectronic circuitry. The photonic devices may be lasers, optical diodes, photodetectors, LEDs, and so forth.

After the direct-bonded optoelectronic interconnects are formed between dies and wafer, the wafer with instances of the dies bonded may be diced or individuated into individual optoelectronic devices, or into groups of optoelectronic devices. For some applications, such as analog camera sensors, a wafer with direct-bonded bonded dies may be left undiced, with an array of the optoelectronic devices forming the grid of the camera sensor on relatively large sections of the wafer.

The photonic devices may also be situated on their own wafer, to be direct-bonded to another wafer bearing CMOS circuitry or other optoelectronic circuitry, providing a wafer-to-wafer (W2 W) process for making mLED arrays, for example.

Figure 9:
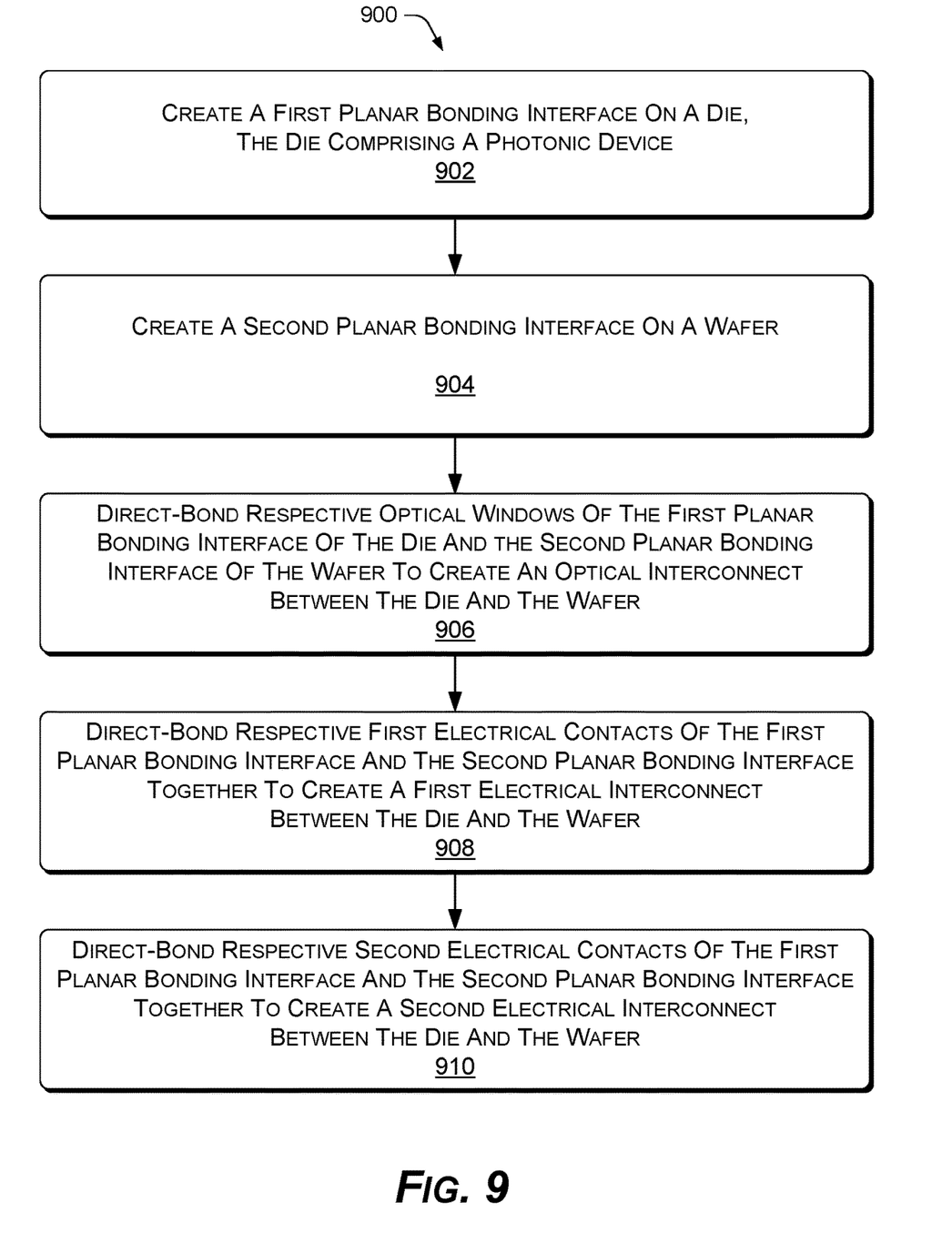
FIG. 9 is a flow diagram of another example method of bonding a die that includes a photonic device utilizing a III-V semiconductor compound to a silicon or SOI wafer to form an optoelectronic interconnect for high-density integrated photonics.

FIG. 9 shows an example method 900 of bonding a die that includes a photonic device, such as a III-V semiconductor photonic device, to a silicon wafer or silicon-on-insulator (SOI) wafer to form an optoelectronic interconnect for high-density integrated photonics. In the flow diagram of FIG. 9, operations of the example method 900 are shown as individual blocks.

At block 902, a first planar bonding interface is created on a die comprising a photonic device based on a III-V semiconductor compound with fully-processed metal contacts.

At block 904, a second planar bonding interface is created on a silicon or SOI wafer.

At block 906, respective optical windows of the first planar bonding interface of the die and the second planar bonding interface of the silicon or SOI wafer are direct-bonded together to create an optical interconnect between the die and the silicon or SOI wafer.

At block 908, respective first electrical contacts of the first planar bonding interface of the die and the second planar bonding interface of the silicon or SOI wafer are direct-bonded together to create a first electrical interconnect between the die and the silicon or SOI wafer.

At block 910, respective second electrical contacts of the first planar bonding interface of the die and the second planar bonding interface of the silicon wafer or wafer are direct-bonded together to create a second electrical interconnect between the die and the silicon or SOI wafer.

The coplanar optical windows, first electrodes, and second electrodes enable a direct-bonding operation, such as direct hybrid bonding (DBI® for example) to bond both the optical path and the electrical paths in the combined optoelectronic interconnect formed thereby. There is only one planar bonding interface for both optical and electrical interconnects to be created in one bonding operation. The combined optical and electrical interconnect enables high-density integration of photonics into microelectronic packages, because the adhesive-free dielectric-to-dielectric bonding and the solder-free metal-to-metal bonding employed can create high-density electrical interconnects on the same bonding interface as the bonded optical interconnect. Since the optoelectronic dies may be fully-processed to begin with, known-good-dies may be used, which is not possible conventionally. Since the optoelectronic dies begin as fully-processed components, photolithography over their top surfaces can scale to high density.

In the specification and following claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A direct-bonded optoelectronic interconnect, comprising:
   a first bonding plane of a first die or wafer comprising a first optical window and electrical contacts of a photonic device of the first die or wafer;
   a second bonding plane of a second die or wafer comprising a second optical window and electrical contacts of the second die or wafer; and
   the optical windows of the first die or wafer and the second die or wafer direct-bonded together; and
   respective electrical contacts of the first die or wafer and the second die or wafer direct-bonded together.

2. The direct-bonded optoelectronic interconnect of claim 1, wherein the electrical contacts of the first die or wafer at least partially circumscribe the first optical window of the first die or wafer, or the electrical contacts of the second die or wafer at least partially circumscribe the second optical window of the second die or wafer.

3. The direct-bonded optoelectronic interconnect of claim 1, wherein the first optical window and the second optical window are direct-bonded together by a dielectric-to-dielectric direct bond without a separate adhesive, or by a direct bond of a direct hybrid bonding operation; and
   wherein the electrical contacts of the first die and the electrical contacts of the second die are direct-bonded together by a metal-to-metal direct-bond, or by a direct bond of the direct hybrid bonding operation.

4. The direct-bonded optoelectronic interconnect of claim 1, further comprising:
   a first bonding plane associated with the first die comprising the first optical window, a first electrical contact at least partially circumscribing the first optical window and coplanar with the first optical window, and a second electrical contact at least partially circumscribing the first electrical contact and coplanar with both the first electrical contact and the first optical window; and
   a second bonding plane associated with the second die comprising the second optical window, a first electrical contact of the second die at least partially circumscribing the second optical window and coplanar with the second optical window, and a second electrical contact of the second die at least partially circumscribing the first electrical contact of the second die and coplanar with both the first electrical contact of the second die and the second optical window.

5. An apparatus, comprising:
   a first die including an optoelectronic device;
   an optical coupling area of the first die in optical communication with the optoelectronic device;
   a coupling plane of the first die for optically and electrically coupling with a complementary coupling plane of a second die, a part of the coupling plane of the first die containing the optical coupling area of the first die;
   a first electrical contact of the optoelectronic device disposed outside a perimeter of the optical coupling area in the coupling plane of the first die; and
   a second electrical contact of the optoelectronic device disposed outside a perimeter of the first electrical contact in the coupling plane of the first die,
   wherein the first electrical contact completely surrounds the optical coupling area in the coupling plane of the first die, and
   wherein the first electrical contact of the optoelectronic device of the first die is disposed outside a perimeter of an optical coupling area of a silicon waveguide of the second die.

6. The apparatus of claim 5, further comprising:
   the second die including an optoelectronic circuit, wherein the first die is capable of optically and electrically coupling with the second die upon joining respective coupling planes of the first die and the second die;
   a first electrical contact of the optoelectronic circuit disposed outside a perimeter of the optical coupling area of the second die in the coupling plane of the second die, the first electrical contact of the optoelectronic circuit matching a planar geometric profile of the first electrical contact of the first die; and
   a second electrical contact of the optoelectronic circuit disposed outside a perimeter of the first electrical contact of the optoelectronic circuit in the coupling plane of the second die, the second electrical contact of the optoelectronic circuit matching a planar geometric profile of the second electrical contact of the first die,
   wherein the silicon waveguide is in optical communication with the optical coupling area of the second die, and
   wherein the optical coupling area of the second die occupying a part of the coupling plane of the second die.

7. The apparatus of claim 6, wherein an electrical routing from the optoelectronic circuit of the second die to the first and second electrical contacts of the optoelectronic circuit is within the coupling plane of the second die.

8. The apparatus of claim 7, wherein the second electrical contact of the optoelectronic circuit comprises an open-loop or a discontinuous trace within the coupling plane of the second die, further comprising a gap in the open-loop of the discontinuous trace for accommodating the electrical routing to the first electrical contact of the optoelectronic circuit within the coupling plane of the second die.

9. The apparatus of claim 6, wherein the optical coupling area of the second die includes at least a grating surface for an optical mode-match coupling between the first die and the second die.

10. The apparatus of claim 9, wherein the grating surface is less than 10 microns (μ) thick for single mode infrared transmission.

11. The apparatus of claim 6, further comprising:
    an optical couple between the optical coupling area of the first die and the optical coupling area of the second die in a joined coupling plane;
    a metal-to-metal bond or a direct hybrid bond between the first electrical contact of the optoelectronic device of the first die and the first electrical contact of the optoelectronic circuit of the second die in the joined coupling plane; and
    a metal-to-metal bond or a direct hybrid bond between the second electrical contact of the optoelectronic device of the first die and the second electrical contact of the optoelectronic circuit of the second die in the joined coupling plane.

12. The apparatus of claim 11, further comprising a transparent conductive oxide (TCO) between a III-V compound semiconductor and the silicon waveguide to enhance electrical conductivity into the III-V compound semiconductor and to enhance a uniformity of the electrical conductivity.

13. The apparatus of claim 12, wherein the transparent conductive oxide (TCO) is selected from a group consisting of aluminum doped zinc oxide (AZO), gallium doped zinc oxide (GZO), and indium tin oxide (ITO).

14. The apparatus of claim 5, further comprising a bottom surface of a III-V compound semiconductor roughened by etching to reduce a reflection loss.

15. The apparatus of claim 5, further comprising a dielectric material between a bottom surface of a III-V compound semiconductor and the silicon waveguide to reduce a reflection loss between the III-V compound semiconductor and the silicon waveguide, wherein the dielectric material has a refractive index between an index of refraction of silicon of silicon waveguide and an index of refraction of the III-V compound semiconductor.

16. The apparatus of claim 15, wherein an optical thickness between the bottom surface of the III-V compound semiconductor and a top surface of the silicon waveguide is an odd multiple of one-quarter of a wavelength of an operative light of the apparatus.

17. The apparatus of claim 16, further comprising a reflective layer on top of the optoelectronic device of the first die on a surface opposite to a bond surface.

\* \* \* \* \*